INVENTOR.
EUGENE R. KEELER
BY
Davis, Hoxie, Faithfull & Hapgood
ATTORNEYS

Nov. 17, 1970 E. R. KEELER 3,540,207

ELECTRONIC WATCH COUNTING CIRCUIT

Filed Sept. 20, 1968 2 Sheets-Sheet 2

INVENTOR.
EUGENE R. KEELER

BY

Davis, Hoxie, Faithfull & Hapgood
ATTORNEYS

United States Patent Office 3,540,207

Patented Nov. 17, 1970

3,540,207

ELECTRONIC WATCH COUNTING CIRCUIT

Eugene R. Keeler, Suffern, N.Y., assignor to Timex Corporation, Waterbury, Conn., a corporation of Connecticut

Filed Sept. 20, 1968, Ser. No. 761,230
Int. Cl. G04c *3/00*
U.S. Cl. 58—23 7 Claims

ABSTRACT OF THE DISCLOSURE

An electronic horological instrument includes a piezoelectric crystal oscillator and a counter such as a series of count-down circuits in tandem. The effective frequency of the oscillator is adjusted (trimmed) by adjusting the period of a one-shot multivibrator which inhibits the oscillator pulses.

Figure 1:
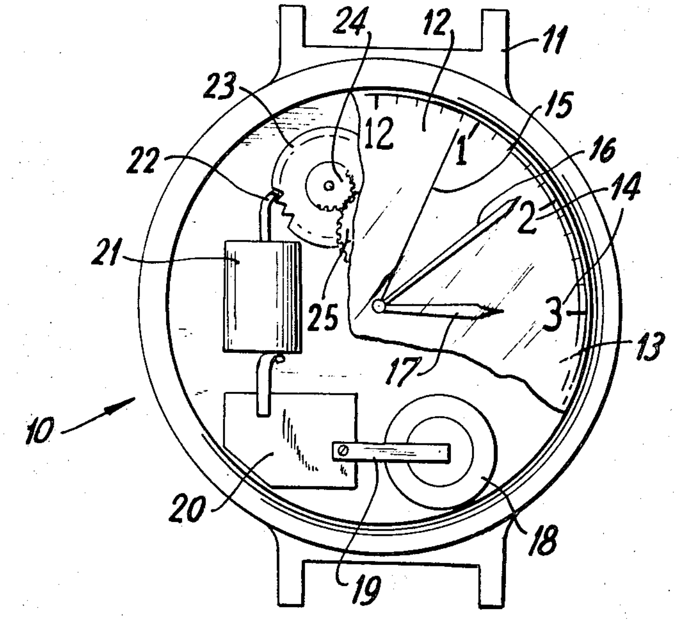

The present invention relates to horology and more particularly to the frequency adjustment of an electronic watch.

One of the most accurate types of horological instruments is a clock whose time base utilizes a piezoelectric crystal oscillator. This type of clock has been widely used in systems requiring great accuracy, for example, in telephone communications and in astronomy. It has been proposed that crystal oscillators could be used as the time base in a highly accurate watch. Such a watch would possess some advantages compared to watches utilizing a mechanical balance wheel, a tuning fork, or other forms of mechanical oscillators. The high frequency of the crystal, and its method of operation, would mean that a watch having a crystal as its time base would be practically immune to changes in timekeeping because of alterations in the orientation of the watch, i.e., position error. The high frequency of the crystal indicates that the frequency be divided by an electronic circuit. Such a circuit, compared to a mechanical take-off such as a pawl and index wheel, may be less subject to damage or maladjustment because of shocks and less subject to wear.

Despite these advantages, crystal oscillators have not been utilized commercially in watches. A watch is small in size and the battery of an electronic watch must correspondingly be small and with little power. As a small crystal will occupy little space and consume little power, the crystal should be small. However, it is difficult to produce a small piezoelectric crystal having an exact predetermined frequency. An error of only 0.01% (one part in ten thousand) in the frequency results in an error of about ten seconds a day or five minutes a month, which is unacceptable. This difficulty increases when the problems of mass production are considered. Highly trained workers are required to produce suitable crystals because of the small size of the crystal and the need for its exact frequency. But even when the crystal is accurately manufactured to its specified frequency, it may drift from that frequency due to the effects of age and environmental conditions. Generally, the watch repairman would not have the tools or the skill to readjust (retrim) a piezoelectric crystal. The aging of the crystal may introduce an error of as much as one second a day for each month of age. After three years, the watch, simply from aging of the crystal, may have as much error as eighteen minutes a month, an entirely unacceptable amount.

It is the object of the present invention to provide a system in an electronic watch in which a piezoelectric crystal may be accurately adjusted, in its effective frequency, to an exact predetermined frequency.

It is a further objective of the present invention to provide a system, in an electronic watch, in which the effective frequency of a piezoelectric crystal may be adjusted at comparatively low cost, and in which such an adjustment may be made in the manufacturing process or in the course of repairing the timekeeping of the watch by a watch repairman.

It is a further objective of the present invention to provide an electronic watch in which the drift of frequency with the aging of the piezoelectric crystal is compensated so that the effective frequency of the system is stable with age.

In accordance with the present invention, an electronic watch is provided having a case and a source of electrical power, such as a battery cell or a solar cell and a battery. The watch movement includes a piezoelectric crystal as its time base and a counting circuit, such as a series of dividing (count-down) circuits in tandem. The counting circuit provides an output at a predetermined and accurate rate to operate a time display, for example, a motor which rotates time indicating hands or an electro-optical display.

The piezoelectric crystal is small, so that it fits within the case and minimizes power consumption. The crystal is not manufactured to a final and accurate predetermined frequency, which minimizes its cost. The crystal is manufactured so that its inherent frequency is somewhat above the desired effective frequency. The effective frequency of the crystal is determined by the adjustment of the operating time (delay period) of a one-shot multivibrator. The multivibrator inhibits the oscillator pulses for a predetermined time, i.e., a predetermined number of pulses per second, which is set so that the effective frequency of the system is the desired frequency. The adjustment of the inhibiting multivibrator provides a method which has the same effect as trimming the crystal, but at a lower cost and using less skilled labor. In addition, as the crystal ages and its inherent natural frequency changes, the watch repairman may readily readjust the effective frequency of the system, without touching the crystal, by adjusting the inhibiting multivibrator. The effects of aging on the crystal may automatically be nullified by a device which provides an automatic adjustment, with age, of the inhibiting multivibrator. The multivibrator should be compensated to the same extent, but opposite in effect, as the aging of the crystal. Similarly, the adverse effect of temperature changes may be compensated by placing a temperature sensitive element as a control of the inhibiting multivibrator.

Figure 2:
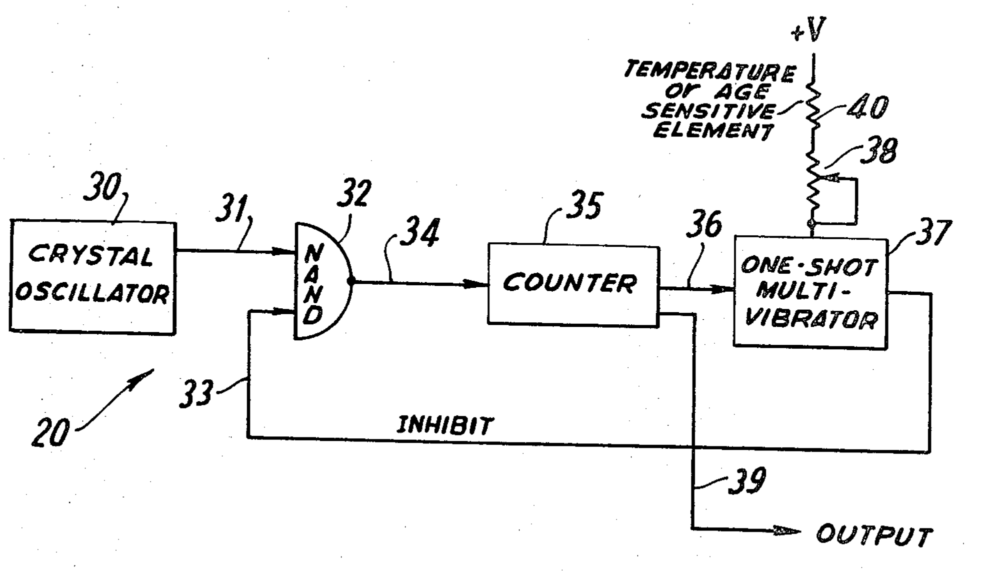
Figure 3:
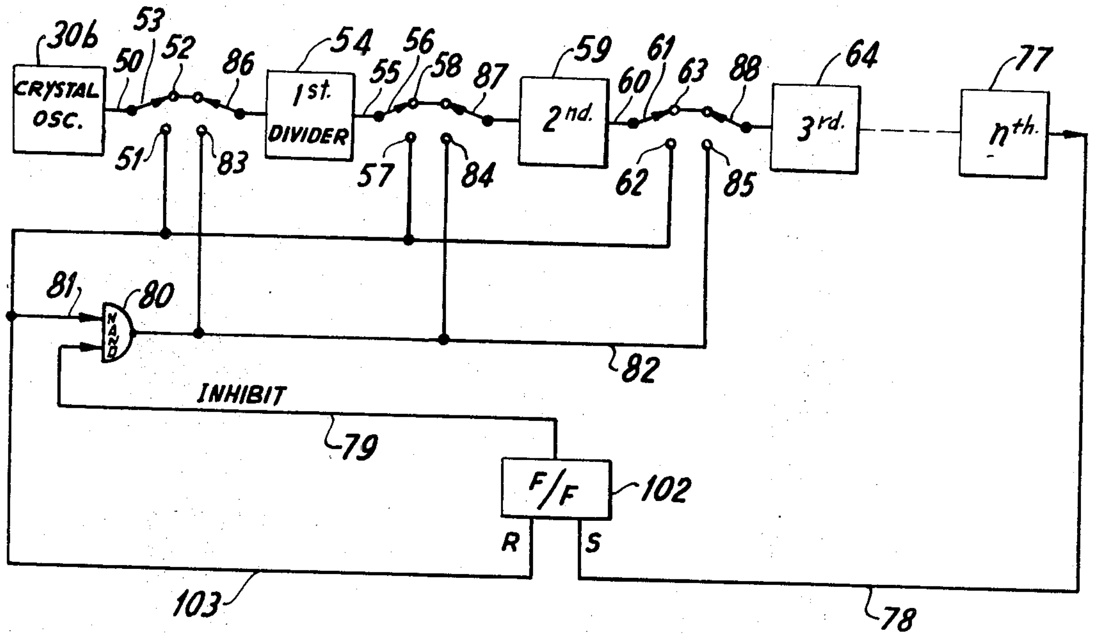
Figure 4:
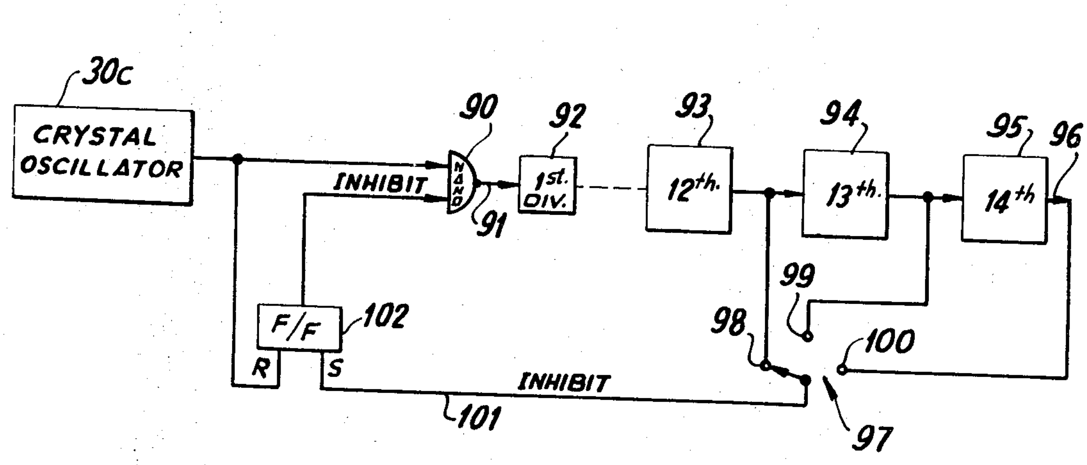

Other objectives of the present invention will be apparent from the following detailed description of the preferred embodiment of the invention, taken in conjunction with the accompanying drawings. In the drawings:

FIG. 1 is a top plan view, partly cut-away, showing the watch of the present invention; and FIGS. 2, 3 and 4 are block schematic diagrams of the electronic system of the watch of FIG. 1.

The present invention is described in connection with a wrist watch, but it is applicable to other types of horological instruments such as pocket watches. As shown in FIG. 1, the wrist watch of the present invention includes a case 10 having an integral bezel portion 11. A transparent crystal 12 covers the face of the watch. A dial plate 13, positioned below the crystal 12, has a plurality of numbers 14 to indicate time. The watch has a sweep seconds hand 15, a minute hand 16, and an hour hand 17.

The power for the movement is furnished by the small battery cell 18, although other sources of power, such as a solar cell and a battery, may alternatively be employed. A spring contact 19 connects battery 18 to an electronic circuit 20, which is described in detail in connection with FIG. 2. The electronic circuit 20 pulses a motor 21, which may be an electromagnetic reciprocating solenoid. The motor 21 reciprocates pawl 22 at a predetermined rate, for example, once per second. The pawl 22 rotates index wheel 23. A pinion 24, attached to the same staff as the wheel 23, turns the wheel 25. The wheels, as in conventional watches, form part of a gear train which drives the seconds, minutes and hour hands.

The electronic circuit is shown in FIG. 2. It includes a piezoelectric crystal oscillator 30. The crystal is manufactured so that its inherent frequency is somewhat above the desired effective frequency. For example, if the effective frequency is to be 16,384 Hz., then the crystal is manufactured to be about 16,388 Hz. The crystal, if it is manufactured by cutting, is not finally trimmed to resonate at 16,384 Hz.—but is left at the higher frequency of about 16,388 Hz. The crystal oscillator 30 is connected, by line 31, to a logic "NAND" element 32. The element 32 has inputs 31 and 33 and output 34. The "NAND" element 32, when it is pulsed by its input 33, will not produce an output at output line 34, unless there is a pulse at input line 31. For example, element 32 may be a two-diode "NAND" gate clocked by the pulses from oscillator 30. In other words, a ground level voltage at input 33 inhibits an output at output 34 in the presence of an input at line 31.

The output of element 32 is connected to a counter 35, which is a count-down or dividing circuit. The counter 35, when the crystal oscillator has a frequency of 16,384 Hz., divides by $2^{14}$. For example, counter 35 consists of 14 binary flip-flop circuits in tandem. One output 36 of counter 35 couples to a one-shot multivibrator 37. The multivibrator has a cycle (duty) time period which is adjustable by potentiometer 38. Preferably, the cycle time may be adjusted from 0 to 480 microseconds. The multivibrator 37 is connected to inhibit gate 33 of the "NAND" element 32. If the cycle time is set at 244 microseconds, then the multivibrator will inhibit the element 32 for 244 microseconds out of every second, i.e., 244 parts per million. At the frequency rate of 16,388 Hz., this would mean $.000244 \times 16{,}388$ or a period of 3.798 pulses per second, which would inhibit 3 pulses per second.

$$\frac{3 \times 86{,}400 \text{ (seconds per day)}}{16{,}388 \text{ Hz.}}$$

seconds per day are inhibited. The multivibrator, with its inhibit time of 480 microseconds, may inhibit 8 cycles a second or 40 seconds a day.

Preferably, the natural frequency of the crystal is selected so that it is greater than the final desired frequency but less than the full capability of the inhibiting multivibrator. In that way the inhibition cycle period of the multivibrator may be adjusted to give a longer or a shorter inhibition period. For example, the crystal has a frequency of 16,388 Hz. and the desired frequency from the logic element is 16,384 Hz. The multivibrator is adjusted to provide an inhibit time of 244 microseconds and may be adjusted to provide a range of $-244$ and $+244$ microseconds, i.e., a total range of 488 microseconds. This adjustment range is $\pm 4$ pulses per second or $\pm(4/16{,}388) \times 86{,}400$ or $\pm 21$ seconds per day.

A second output line 39 from the counter 35 is utilized to drive the motor 21 or other time display means.

The potentiometer 38 may have a temperature or age sensitive impedance element 40. The temeprature sensitive element 40, for example, a thermistor, has a temperature coefficient which is similar in its curve, but opposite in its sign, to the temperature coefficient of the crystal. If the crystal frequency rises with an increase in temperature, the impedance 40 would have the effect of increasing the inhibit cycle period to exactly counteract the increase in frequency. Similarly, if the frequency of the crystal falls with age, the element 40 is selected to age at the same rate, but opposite in effect, to decrease the inhibit cycle period and thereby exactly counteract the effect of aging of the crystal.

The time display has been shown in FIG. 1 as utilizing a motor and gear-driven hands. However, other time displays may be utilized. For example, an electro-optical display utilizing lamps or other optical devices, such as a liquid crystal material, may be driven directly from the counter by using a decoding logic network.

The term "one-shot multivibrator" includes those circuits, regardless of pulse shape, which may be utilized to inhibit the logic element for an adjusted time period. It is necessary, however, that the repetition rate of the inhibiting pulse producing circuit be triggered by the counter. For example, a relaxation oscillator whose output pulse envelope is adjustable in duration and which inhibits the conduction of pulses from oscillator 30 to counter 35 may be utilized, if it is triggered by the counter.

An alternative to the electronic circuit shown in FIG. 2 is the circuit of FIG. 3. In the circuit of FIG. 3 a crystal oscillator 30*b* has an output connection 50 which may be switched between two terminals 51 and 52 by switch 53. The terminal 52 is connected to the first divider 54, which may be a flip-flop circuit. The output of the first divider 54 has a terminal 55 which may be switched, by switch 56, to terminals 57 and 58. Terminal 58 is connected to the second divider 59. Similarly, the second divider 59 has an output terminal 60 which may be switched, by switch 61, between the terminals 62 and 63. The terminal 63 is connected to the third divider. The third divider is connected in tandem to eleven other dividing, i.e., count-down, circuits, the last one of which is divider 77. Divider 77 has an output 78 which provides a pulse at one-second intervals. The output of the last divider 77 is carried by the inhibit line 79 to the input gate of the "NAND" circuit 80. The second input gate 81 of the "NAND" circuit 80 is connected to the switch terminals 51, 57 and 62. The output gate 82 of the "NAND" circuit 80 is connected to the switch terminals 83, 84 and 85, which are connected to, respectively, the first divider 54, the second divider 59 and the third divider 64 by respective switches 86, 87 and 88.

In the circuit of FIG. 3 the output of the last divider 77, at the rate of one pulse per second, is used to set an inhibit flip-flop 102 which is connected to the inhibit input 79 of the "NAND" circuit 80. The setting of flip-flop 102 inhibits the next pulse arriving on input line 81. This next pulse, on line 103, re-sets the flip-flop 102, removing the inhibition. The "NAND" circuit 80 may be placed, by the switching means, alternatively as an inhibitor of the pulses from the crystal oscillator 30*b*, the first divider 54 or the second divider 59. If the crystal oscillator is selected to be of a frequency of 16,388 Hz. then the switching of the "NAND" gate between the crystal oscillator and the first divider will result in an effective frequency of 16,387 Hz. If the "NAND" circuit is switched to between the first divider and the second divider, the effective frequency would be 16,386 Hz. If the "NAND" circuit is switched to between the second divider 59 and the third divider 64, the effective frequency would be 16,384 Hz. It is possible to utilize two such "NAND" gates in order to achieve a finer degree of inhibition. For example, if one "NAND" gate is switched between the crystal oscillator and the first divider and the second "NAND" gate is switched between the third divider and the fourth divider, there will be an inhibition of 9 pulses and the effective frequency would be 16,379 Hz.

A further alternative embodiment of the present invention is shown in FIG. 4. In FIG. 4 the crystal oscillator 30*c* is conected to an input of the "NAND" circuit 90. The output gate 91 of the "NAND" circuit is connected to the first divider 92. The first divider 92 is connected in tandem to a series of dividers, only the twelfth, thirteenth and fourteenth dividers being shown. An output of the twelfth divider 93 is connected to the thirteenth divider 94. An output of the thirteenth divider is connected to the fourteenth divider 95, which provides the final output 96. A switch 97 has three terminals 98, 99 and 100. The terminal 98 is connected to the output of the twelfth divider, the terminal 99 is connected to the output of the thirteenth divider and the terminal 100 is connected to the output of the fourteenth divider. The switch 97 connects the inhibit line 101 to any one of the terminals 98, 99 and 100. The number of pulses of the crystal oscillator which are inhibited may be selected by selecting the terminals of switch 97. The terminal 100 would inhibit one pulse, terminal 99 would inhibit two pulses, and terminal 98 would inhibit four pulses.

I claim:

1. A horological instrument comprising:
a high-frequency electrical oscilllator,
a count-down circuit coupled to the oscillator to receive an input signal therefrom and provide a lower frequency output signal,
a source of electrical power,
an inhibit circuit conected to the source of electrical power and to the count-down circuit wherein the lower frequency output signal is adjusted and fed to the count-down circuit to control the effective frequency of the oscillator, and
time indicating means coupled to the count-down circuit to be activated thereby.

2. A horological instrument as in claim 1 wherein:
the inhibit circuit comprises a multivibrator triggered by the count-down circuit and a NAND circuit connected between the oscillator and the count-down circuit, said NAND circuit gating oscillator pulses to the count-down circuit upon a signal from the multivibrator.

3. A horological instrument as in claim 2 wherein:
the oscillator comprises a piezoelectric crystal oscillator, and
the multivibrator comprises a one-shot multivibrator wherein the pulse delay of the multivibrator is adjustable.

4. A horological instrument as in as claim 2 further including:
temperature sensitive means for controlling the pulse delay of the multivibrator.

5. A horological instrument as in claim 2 further including:
age sensitive means for controlling the pulse delay of the multivibrator.

6. A horological instrument as in claim 1 further including:
switching means for selectively switching the inhibit circuit into series connection with the oscillator.

7. A horological instrument as in claim 1 wherein:
the count-down circuit comprises a plurality of series-connected divider circuits, and,
the instrument further includes switching means for selectively switching the inhibit circuit into connection with one of said divider circuits to obtain a predetermined pulse delay signal therefrom.

References Cited

UNITED STATES PATENTS

| | | | |
|---|---|---|---|
| 3,218,533 | 11/1965 | Reich | 318—129 |
| 3,451,210 | 6/1969 | Helterline et al. | 58—26 |

FOREIGN PATENTS

| | | |
|---|---|---|
| 791,946 | 8/1968 | Canada. |

RICHARD B. WILKINSON, Primary Examiner

E. C. SIMMONS, Assistant Examiner

U.S. Cl. X.R.

58—25